US 6,639,230 B2

United States Patent
Kwon

(10) Patent No.: US 6,639,230 B2
(45) Date of Patent: Oct. 28, 2003

(54) HIGH-ENERGY ION IMPLANTER FOR FABRICATING A SEMICONDUCTOR DEVICE

(75) Inventor: Young-Soo Kwon, Goyang (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/131,080

(22) Filed: Apr. 25, 2002

(65) Prior Publication Data
US 2002/0171049 A1 Nov. 21, 2002

(30) Foreign Application Priority Data
Apr. 27, 2001 (KR) ........................................ 2001-23001

(51) Int. Cl.[7] .............................................. H01J 37/08
(52) U.S. Cl. .................. 250/492.21; 250/251
(58) Field of Search .................... 250/492.1, 492.2, 250/251, 492.21, 492.3, 551

(56) References Cited

U.S. PATENT DOCUMENTS 6,462,331 B1    10/2002  Choi et al. ................... 250/251
2002/0050577 A1 * 5/2002  Cha ............................. 250/551

FOREIGN PATENT DOCUMENTS

KR          97-014050    *   4/1997   ......... H01L/21/265

OTHER PUBLICATIONS

Sears, Zemansky, and Young, University Physics, May 1983, Addison–Wesley Publishing Company, 6th Edition, p. 567.

* cited by examiner

Primary Examiner—John R. Lee
Assistant Examiner—Christopher M. Kalivoda
(74) Attorney, Agent, or Firm—Lee & Sterba, P.C.

(57) ABSTRACT

A high-energy ion implanter for fabricating a semiconductor device includes a low-energy accelerator for converting a polarity of ions flowed in from an ion source; a stripper for converting the ions accelerated from the low-energy accelerator to positive ions in vacuum conditions; a high-energy accelerator for accelerating, in high-energy, the positive ions that are converted in the stripper; a turbo pump for providing vacuum conditions in the stripper; a current sensor for detecting currents to check for abnormal operating conditions of the turbo pump; and a central processing unit (CPU) that interrupts a circuit breaker to suspend the ion implanting process in response to the level of current detected in the current sensor. The high-energy ion implanter of the present invention is capable of preventing an unsuccessful ion implanting process by suspending operation thereof when abnormal operating conditions are detected.

7 Claims, 4 Drawing Sheets

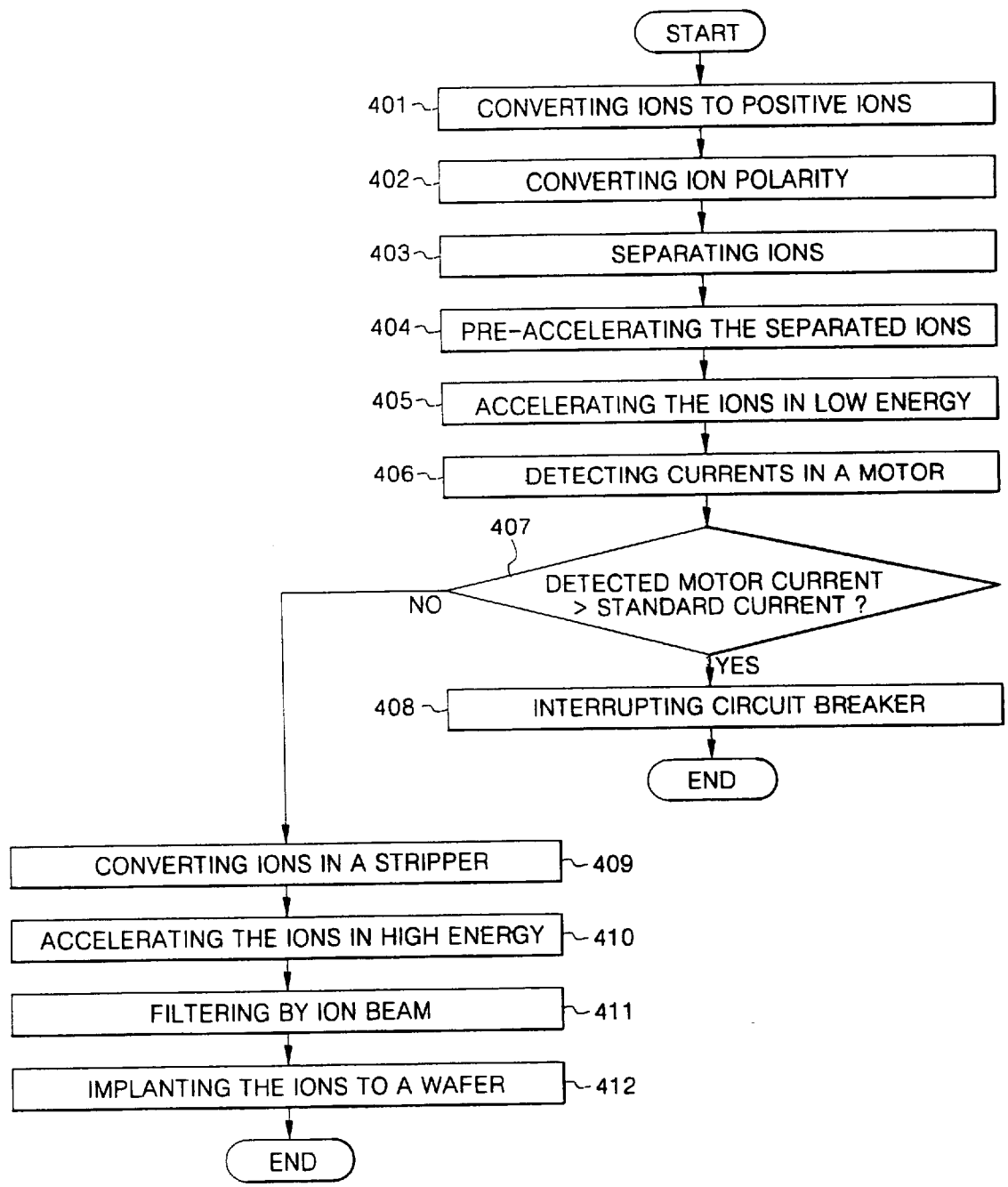

HIGH-ENERGY ION IMPLANTER FOR FABRICATING A SEMICONDUCTOR DEVICE

BACKGROUND OF THE INVENTION

1. Field of the Invention

The present invention relates to a high-energy ion implanter for fabricating a semiconductor device. More particularly, the present invention relates to a high-energy ion implanter, which is capable of detecting abnormal operating conditions of a turbo pump that provides a predetermined vacuum in a stripper, to implant an impurity into a wafer to fabricate a semiconductor device. The present invention prevents yield loss and wafer defects caused by abnormal operating conditions of the turbo pump.

2. Description of the Related Art

Conventionally, a semiconductor device is fabricated by performing several sequential processes, such as photolithography, ion implanting and diffusion, and etching to a wafer. The ion implanting process, one process in the fabrication of a semiconductor device, implants impurities as an ion type into a wafer, thereby providing a semiconductor device with a predetermined electric characteristic.

To ionize an impurity in the ion implanting process, it is necessary to provide a vacuum having a predetermined level. Accordingly, an ion implanter should be equipped with a turbo pump to provide vacuum conditions.

The ion implanter for implanting an impurity as an ion type into a wafer may be typically referred to as a medium current, a high current, or a high-energy ion implanter, according to usages and process conditions. Regardless of the type of ion implanter, however, the relevant principles are similar.

In other words, when the implanting ion accelerates ionized dopants to a wafer surface, the accelerated ion is implanted into a wafer. In this case, dopant amounts and ion implanting depth are closely related to atomic size, ion speed and duration of time the wafer is exposed to an ion implanting beam.

A high-energy ion implanter equips a large acceleration tube to a medium current ion implanter or, additionally, to a high-current ion implanter. Therefore, the size of a high-energy ion implanter is larger than that of any other conventional ion implanter. Additionally, a beam path thereof is long.

Referring to FIG. 1, a conventional high-energy ion implanter includes an ion source 100, a vaporizer cell 101, an analyzer magnet 102, a pre-accelerator 103, a tendetron accelerator 315, and a beam filter 108.

In operation, the ion source 100 generates positive ions from boron fluoride ($BF_3$) gas, and the vaporizer cell 101 converts the positive ions from the ion source 100 into a desired polarity by utilizing magnesium (Mg). The analyzer magnet 102 separates a desired ion (i.e., a negative ion) from the polarized ions in the vaporizer cell 101. The pre-accelerator 103 applies a predetermined voltage to the separated ions (i.e., negative ions) from the analyzer magnet 102 and accelerates the separated ions by utilizing voltage differences.

The tendetron accelerator 315 includes a low-energy accelerator 104, a stripper 105, a high-energy accelerator 106 and a turbo pump 107. The low-energy accelerator 104 draws the ions from the pre-accelerator 103 and accelerates the ions for smooth polarity conversion. The stripper 105 eliminates electrons from the ions accelerated from the low-energy accelerator 104 in vacuum conditions by a stripping gas (e.g., nitrogen) to generate positive ions. Next, the high-energy accelerator 106 accelerates the positive ions generated from the stripper 105. The turbo pump 107 pumps the stripper 105 to provide vacuum conditions therein. The beam filter 108 filters the ion beam accelerated from the high-energy accelerator 106 of the tendetron accelerator 315 in an electrostatic state and implants the ion beam into a wafer transferred from a wafer transfer chamber 109.

The above described conventional high-energy ion implanter generates positive ions from the gas ionized in the ion source 100, wherein the ionized gas generated in the ion source 100 is sent to the vaporizer cell 101. The vaporizer cell 101 changes the polarity of the ions by utilizing magnesium (Mg) and the analyzer magnet 102 separates desired negative ions. More specifically, after initially accelerating the ions in desired energy states (e.g., 100 keV) through the pre-accelerator 103, the ions are accelerated again in the low-energy accelerator 104 of the tendetron accelerator.

The negative ions accelerated from the low-energy accelerator 104 are converted into positive ions, after the stripping gas (e.g., nitrogen) eliminates electrons in the vacuum conditions applied by the turbo pump 107. More particularly, the converted ions are accelerated again through the high-energy accelerator 106 and beam ions, which are filtered through the beam filter 108, are implanted into a wafer transferred from the wafer transfer chamber 109.

To implant positive ions into a wafer, the turbo pump 107 provides vacuum conditions in the stripper 105 for extracting positive ions only and for eliminating negative ions, by the stripping gas, from the ions accelerated from the low-energy accelerator 104. Referring to FIG. 2, another conventional high-energy ion implanter includes a turbo pump 107 including a circuit breaker 200 for supplying and interrupting power voltages applied from an outside source, a rotatable motor 201 for receiving the power voltages through the circuit breaker, a power transmission unit 205 for transmitting a rotational driving force from the motor 201 through a pulley 202, a belt 203, and a shaft 204, an electric generator 206 for generating predetermined voltages by the driving force transmitted from the power transmission unit 205, a central processing unit CPU 207 for driving the turbo pump 107, and a monitor 208 for displaying procedures by the CPU 207.

The rotational force from the motor 201, however, is often not normally transmitted to the turbo pump 107 and the generator 206 due to unstable conditions caused by vibrations of the pulley 202 in the power transmission unit 205, tension fluctuations of the belt 203, a broken shaft 204, or the like. Therefore, normal voltages, which are required to operate the pump smoothly and to provide desired vacuum conditions in the stripper 105, are not applied to the turbo pump 107 from the generator 206.

Accordingly, ions flowing in from the stripper 105 have inferior ion characteristics due to the abnormal vacuum conditions. Inferior ion characteristics are a cause of metal impurity generation and wafer defects while implanting the ions into a wafer.

Thus, when technical difficulties occur in the power transmission unit 205, the generator 206, or the turbo pump 107, the circuit breaker 200 interrupts the supply of the power voltages to cease operation of the turbo pump 107 and the generator 206. However, even though difficulties may occur in the turbo pump 107, the motor 201, the power transmission unit 205, or the generator 206, the conventional high-energy ion implanter may not be able to detect the abnormal operating conditions. Therefore, even though the generator 206 or the turbo pump 107 is not operating normally, the circuit breaker 200 does not perform the circuit interruption and continues to supply the AC power voltages to perform the ion implanting process.

As a result, the vacuum conditions in the stripper 105 are not normal due to abnormal operation of the turbo pump 107. The abnormal vacuum conditions generate the phenomena of the inferior ion characteristics, and result in yield losses due to an unsuccessful ion implanting process and due to metal impurities.

SUMMARY OF THE INVENTION

A feature of a preferred embodiment of the present invention is to provide a high-energy ion implanter capable of detecting abnormal operating conditions of a turbo pump for providing vacuum conditions in a stripper, while the stripper converts accelerated and flowed-in ions, to interrupt a circuit breaker. Therefore, an ion implanting process is suspended to prevent an unsuccessful ion implanting process and yield losses due to inferior ion characteristics.

In order to provide the above feature, a preferred embodiment of the present invention provides a high-energy ion implanter for fabricating a semiconductor device including a low-energy accelerator for converting a polarity of ions flowed in from an ion source; a stripper for converting the ions accelerated from the low-energy accelerator to positive ions in vacuum conditions; a high-energy accelerator for accelerating, in high-energy, the positive ions that are converted in the stripper; a turbo pump for providing vacuum conditions in the stripper; a current sensor for detecting currents to check for abnormal operating conditions of the turbo pump; and a central processing unit (CPU) that interrupts a circuit breaker to suspend the ion implanting process in response to the level of current detected in by current sensor.

Preferably, the current sensor is connected between the turbo pump and the circuit breaker to detect currents.

Preferably, the current sensor is a galvanometer for detecting minute currents.

These and other features of the present invention will be readily apparent to those of ordinary skill in the art upon review of the detailed description that follows.

BRIEF DESCRIPTION OF THE DRAWINGS

For a more complete understanding of the present invention and the advantages thereof, reference is now made to the following descriptions taken in conjunction with the accompanying drawings, in which like reference numerals indicate like elements, and in which:

FIG. 4 is a flow chart illustrating the operation of a high-energy ion implanter according to the preferred embodiment of the present invention.

DETAILED DESCRIPTION OF THE INVENTION

Korean Patent Application No. 2001-23001, filed Apr. 27, 2001, and entitled: "High-energy Ion Implanter for Fabricating a Semiconductor Device," is incorporated by reference herein in its entirety.

Figure 1:
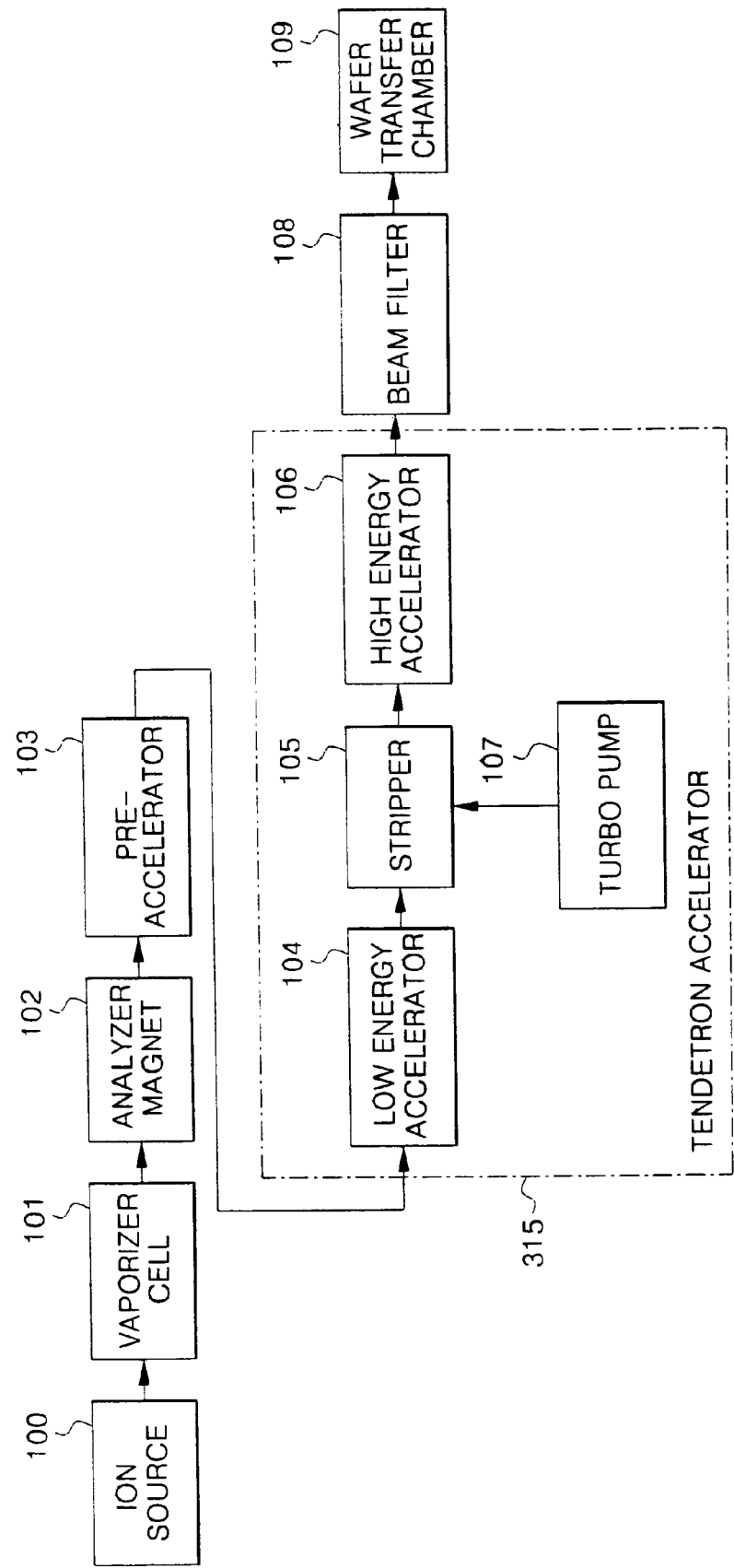
FIG. 1 illustrates a control block diagram of a conventional high-energy ion implanter.
Figure 2:
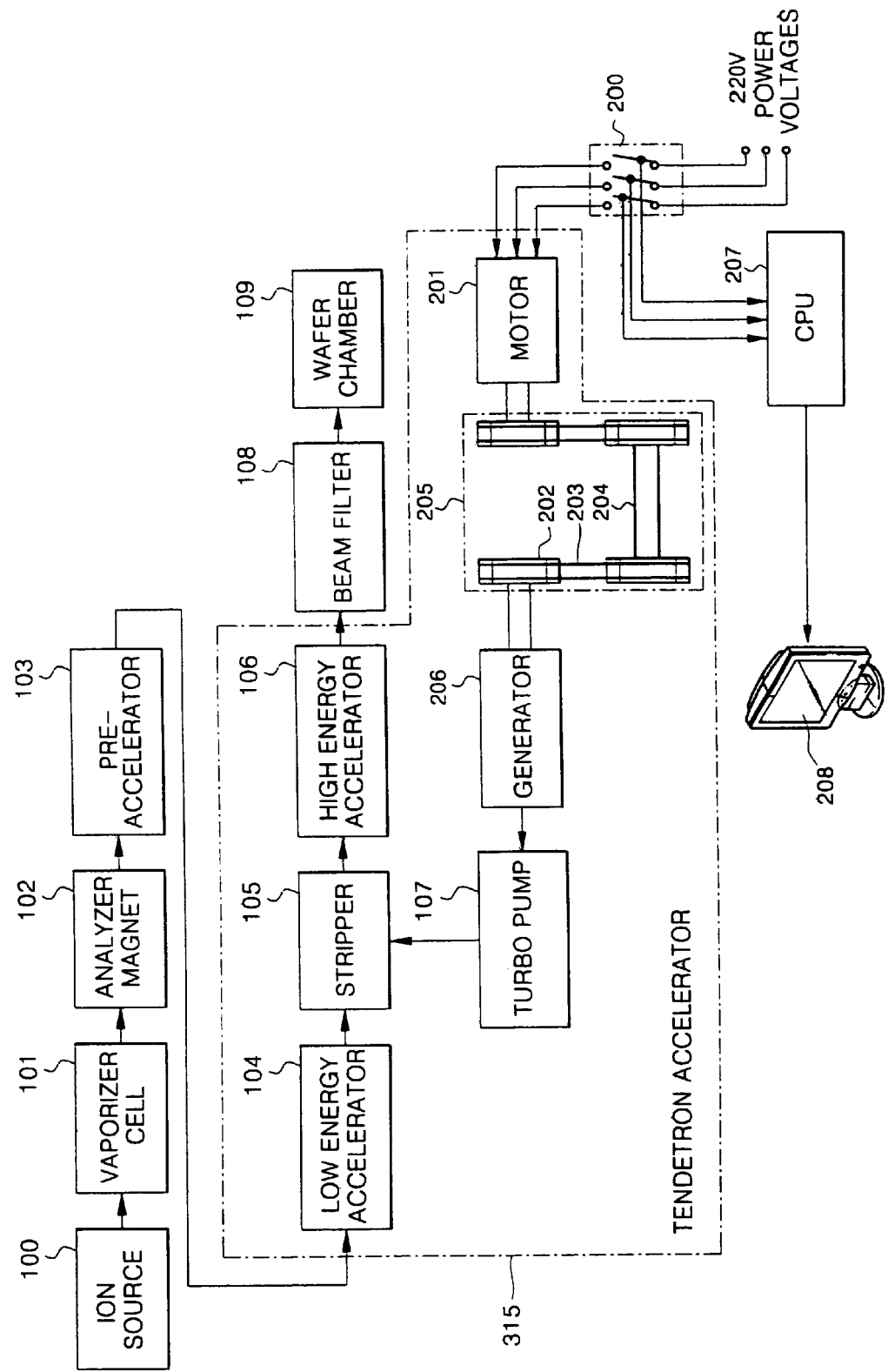
FIG. 2 illustrates a control block diagram of another conventional high-energy ion implanter.
Figure 3:
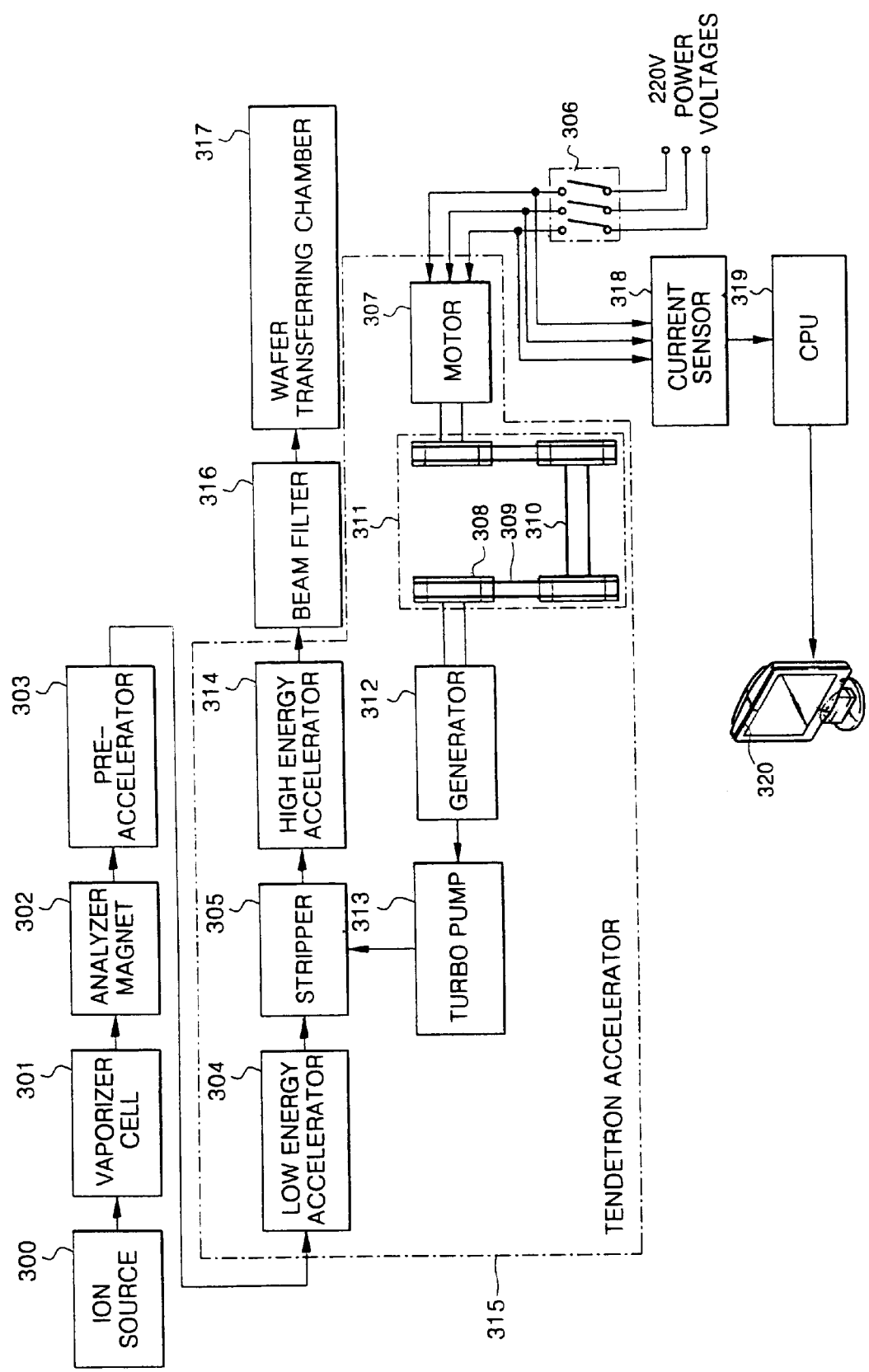
FIG. 3 illustrates a control block diagram of a high-energy ion implanter according to a preferred embodiment of the present invention.

Reference will now be made in detail to preferred embodiments of the present invention, an example of which is illustrated in FIG. 3 of the accompanying drawings.

FIG. 3 illustrates a control block diagram and FIG. 4 is a flow chart illustrating the operation of a high-energy ion implanter according to a preferred embodiment of the present invention.

A high-energy ion implanter of the present invention includes an ion source 300, a low-energy accelerator 304, a stripper 305, a circuit breaker 306, a high-energy accelerator 314, a turbo pump 313, a current sensor 318, and a central processing unit CPU 319. A high-energy ion implanter of the present invention may further include a vaporizer cell 301, an analyzer magnet 302, a pre-accelerator 303, a motor 307, a power transmission unit 311, a generator 312, a tendetron accelerator 315, a beam filter 316, and a monitor 320.

In operation of a preferred embodiment of the present invention, the ion source 300 generates positive ions from boron fluoride ($BF_3$) gas, and the vaporizer cell 301 converts the positive ions from the ion source 300 to a desired polarity by utilizing magnesium (Mg). The analyzer magnet 302 separates desired negative ions from the polarized ions in the vaporizer cell 301. The pre-accelerator 303 applies predetermined voltages to the ions separated by the analyzer magnet 302 and accelerates the ions in a predetermined energy. The low-energy accelerator 304 accelerates the ions from the pre-accelerator 303 in a low energy for smooth polarity conversion. The stripper 305 eliminates electrons from the ions accelerated from the low-energy accelerator 304 in vacuum conditions by a stripping gas and converts the ions into positive ions.

The circuit breaker 306 supplies or interrupts power voltages applied from an outside source. The motor 307 is rotationally driven by receiving the power voltages through the circuit breaker 306. The generator 312 generates voltages by receiving driving forces from the motor 307 through the power transmission unit 311. The power transmission unit includes a pulley 308, a belt 309, and a shaft 310. The turbo pump 313 performs a vacuum pumping operation by receiving voltages generated from the generator 312.

The tendetron accelerator 315 includes the high-energy accelerator 314 for accelerating, in high-energy, the positive ions converted from the stripper 305. The beam filter 316 periodically filters the ion beam accelerated in the high-energy accelerator 314 of the tendetron accelerator 315 and implants the ions into a wafer transferred from a wafer transferring chamber 317. The current sensor 318 detects current flows and outputs a signal of the current flows to the CPU 319. The CPU 319 interrupts the circuit breaker 306 when the value of the current flows detected in the current sensor 318 is over a current value established by a predetermined program. Additionally, the monitor 320 displays control signals outputted from the CPU 319.

Preferably, the current sensor 318 may be connected between the turbo pump 313 and the circuit breaker 306.

Preferably, the current sensor 318 may include a galvanometer for detecting minute currents.

Referring now to FIG. 4, in step 401 of the operation, the above described preferred embodiment of the present invention generates positive ions from the gas ionized from the ion source 300, and the generated ions are flown into the vaporizer cell 301 according to ion implanting orders preset in the CPU 319.

In step 402, in the vaporizer cell 301, the positive ions are converted into a desired polarity by utilizing magnesium (Mg) and the polarized ions are flowed into the analyzer magnet 302. In step 403, the analyzer magnet 302 separates desired negative ions from the flowed-in polarized ions. In step 404, when the separated negative ions are flowed into the pre-accelerator 303, the pre-accelerator 303 accelerates the negative ions to a predetermined energy state and the negative ions are flowed into the low-energy accelerator 304 of the tendetron accelerator 315.

In step 405, the low-energy accelerator 304 draws the negative ions to a high voltage electrode and accelerates the negative ions in order to convert smoothly the polarity of the ions accelerated in the predetermined energy state in the pre-accelerator 303. The accelerated ions are then flowed into the stripper 305.

Using a stripping gas (e.g., nitrogen), the stripper 305, in vacuum conditions provided by the turbo pump 313, eliminates electrons to convert the ions to positive ions. In this case, the motor 307, the power transmission unit 311, the generator 312, and the turbo pump 313 provide the vacuum conditions of the stripper 305. The motor 307 is driven by external power (AC) inputted through the circuit breaker 306.

The power transmission unit 311 includes a pulley 308, a belt 309, and a shaft 310 for transmitting rotational powers by the motor 307. The generator 312 generates voltages by the power transmission unit 311. The turbo pump 313 pumps the stripper 305 to vacuum conditions by receiving voltages generated in the generator 312.

Accordingly, to provide normal vacuum conditions in the stripper 305, normal voltages should be supplied to the turbo pump 313. In step 406, the CPU 319 detects the currents using the current sensor 318, such as a galvanometer, to check whether normal power voltage is supplied to the turbo pump 313 and outputs a signal of the currents to the motor 307.

In step 407, it will be determined whether the currents detected by the current sensor 318 are over a predetermined standard setting value. When the detected currents are not over the predetermined standard setting value, the CPU 319 determines that the turbo pump 313 is being supplied with normal voltages and is performing vacuum pumping operations normally. Accordingly, in step 409, the stripper 305 eliminates electrons from the ions in vacuum conditions by the stripping gas (e.g., nitrogen) and converts the ions into the positive ions to be flowed-into the high-energy accelerator 314.

Thus, in step 410, the high-energy accelerator 314 secondarily accelerates, in high-energy, the flowed positive ions. In step 411, the beam filter 316 filters the secondarily accelerated positive ions in an electrostatic state. Subsequently, in step 412, the filtered positive ions are implanted into a wafer transferred from the wafer transfer chamber 317.

On the contrary, when the currents detected by the current sensor 318, in step 407, are greater than a predetermined standard setting value, the CPU 319 determines that rotational forces of the motor 307 should not be supplied to the generator 312. Accordingly, rotational forces are not transmitted to the generator 312 in the case of abnormal operating conditions, such as loose tension forces in the belt 309 of the power transmission unit 315, a loose joint in the pulley 308, or a bent or broken shaft 310.

Under abnormal operating conditions, the generator 312 is not able to supply a predetermined voltage to the turbo pump 313. Thus, the turbo pump 313 is not able to provide vacuum conditions for stripping the ions in the stripper 305 and a normal ion stripping process is not performed.

Accordingly, in step 408, the CPU 319 interrupts the circuit breaker 306 so that a power voltage is not supplied to the ion implanter and the ion implanting process is suspended. By suspending the ion implanting process when abnormal operating conditions are detected, a failed process may be prevented.

As described above, the high-energy ion implanter of the present invention is capable of detecting abnormal operations of a turbo pump, which provides vacuum conditions in a stripper, while the stripper converts flowed-in ions, during a high-energy ion implanting process in a semiconductor device fabrication process for implanting impurities into a wafer. More particularly, the high-energy ion implanter of the present invention detects currents flowing into a motor transmitting driving forces to a generator, while the generator supplies the power voltage to a turbo pump. When the detected currents are greater than a predetermined setting value, a circuit breaker is interrupted to suspend the ion implanting process. Thus, the present invention may cease abnormal operations of the turbo pump to avoid an unsuccessful ion implanting process and yield losses due to inferior ion characteristics of a stripper.

While the present invention has been particularly shown and described with reference to preferred embodiments thereof, it will be understood by those of ordinary skill in the art that the foregoing and other changes in form and details may be made without departing from the spirit and scope of the present invention as set forth in the following claims.

What is claimed is:

1. A high-energy ion implanter for fabricating a semiconductor device comprising:

a low-energy accelerator for converting a polarity of ions flowed in from an ion source;

a stripper for converting the ions accelerated from the low-energy accelerator to positive ions in vacuum conditions;

a high-energy accelerator for accelerating, in high-energy, the positive ions that are converted in the stripper;

a turbo pump for providing vacuum conditions in the stripper;

a current sensor for detecting currents to check for abnormal operating conditions of the turbo pump;

a central processing unit (CPU) that interrupts a circuit breaker to suspend the ion implanting process is response to the level of current detected by the current sensor;

a motor connected to output terminals of the circuit breaker to generate a rotational driving force;

a generator for generating a predetermined voltage for driving the turbo pump; and a power transmission unit for transmitting the rotational driving force of the motor to the generator.

2. The high-energy ion implanter as claimed in claim 1, wherein the current sensor is connected between the turbo pump and the circuit breaker to detect currents.

3. The high-energy ion implanter as claimed in claim 1, wherein the current sensor is a galvanometer for detecting minute currents.

4. The high-energy ion implanter as claimed in claim 1, wherein the power transmission unit includes a pulley, a belt and a shaft.

5. The high-energy ion implanter as claimed in claim 1, wherein the current sensor is connected between the generator and the turbo pump.

6. The high-energy ion implanter as claimed in claim 1, wherein the current sensor is connected between the motor and the circuit breaker.

7. A method for operating a high-energy ion implanter including a stripper, the stripper being evacuated by a turbo pump and the turbo pump being operated by a power source, the method comprising:

determining an allowed range of current for driving the turbo pump;

applying a power voltage from the power source to a motor connected to the power source through a circuit breaker, the motor providing a rotational driving force for a power transmission unit, the power transmission unit driving a generator for generating a predetermined voltage, and the generator driving the turbo pump;

detecting a current that flows through a current sensor connected to input terminals of the motor;

comparing the detected current with the allowed range of current; and electrically disconnecting the motor from the power source using the circuit breaker when the detected current is out of the allowed range of current.

\* \* \* \* \*